United States Patent
Lin et al.

(10) Patent No.: US 8,487,438 B2
(45) Date of Patent: Jul. 16, 2013

(54) INTEGRATED CIRCUIT SYSTEM HAVING DIFFERENT-SIZE SOLDER BUMPS AND DIFFERENT-SIZE BONDING PADS

(75) Inventors: Yaojian Lin, Singapore (SG); Byung Tai Do, Singapore (SG); Romeo Emmanuel P. Alvarez, Singapore (SG)

(73) Assignee: Stats Chippac Ltd., Singapore (SG)

( * ) Notice: Subject to any disclaimer, the term of this patent is extended or adjusted under 35 U.S.C. 154(b) by 528 days.

(21) Appl. No.: 12/484,099

(22) Filed: Jun. 12, 2009

(65) Prior Publication Data

US 2009/0250813 A1  Oct. 8, 2009

Related U.S. Application Data

(62) Division of application No. 11/162,822, filed on Sep. 23, 2005, now Pat. No. 7,566,650.

(51) Int. Cl.
*H01L 23/485* (2006.01)
(52) U.S. Cl.
USPC ........... 257/751; 257/738; 257/753; 257/758; 257/E23.02; 257/E23.021
(58) Field of Classification Search
USPC ................. 257/688–691, 700, 734, 737, 738, 257/750–766, 780, 781, E23.019–E23.021, 257/E23.023
See application file for complete search history.

(56) References Cited

U.S. PATENT DOCUMENTS

| 5,736,456 | A | 4/1998 | Akram | |
|---|---|---|---|---|
| 6,846,719 | B2 | 1/2005 | Tong et al. | |
| 7,190,080 | B1 | 3/2007 | Leu et al. | |
| 2002/0070438 | A1* | 6/2002 | Ference et al. | 257/685 |
| 2004/0124171 | A1 | 7/2004 | Wu | |
| 2004/0166659 | A1* | 8/2004 | Lin et al. | 438/611 |
| 2005/0017355 | A1* | 1/2005 | Chou et al. | 257/738 |

* cited by examiner

*Primary Examiner* — Marcos D Pizarro
(74) *Attorney, Agent, or Firm* — Ishimaru & Associates LLP; I-Chang John Yang (57) ABSTRACT

An integrated circuit solder bumping system provides a substrate and forms a redistribution layer on the substrate. An insulation layer is formed on the redistribution layer. The insulation layer has a plurality of openings therethrough. A first UBM layer of titanium is deposited on the insulation layer and in the openings therethrough. A second UBM layer of chromium/copper alloy is deposited on the first UBM layer. A third UBM layer of copper is deposited on the second UBM layer. UBM pads of at least two different sizes are formed from the UBM layers. Solder paste is printed over at least some of the UBM pads. The solder paste is reflowed to form at least smaller solder bumps on at least some of the UBM pads. Bigger solder bumps are formed on at least some of the UBM pads.

4 Claims, 6 Drawing Sheets

INTEGRATED CIRCUIT SYSTEM HAVING DIFFERENT-SIZE SOLDER BUMPS AND DIFFERENT-SIZE BONDING PADS

CROSS-REFERENCE TO RELATED APPLICATION

This application is a divisional of U.S. Non-Provisional application Ser. No. 11/162,822 filed Sep. 23, 2005, now U.S. Pat. No. 7,566,650, and the subject matter thereof is hereby incorporated herein by reference thereto.

TECHNICAL FIELD

The present invention relates generally to semiconductor technology, as well as generally to integrated circuit systems that may include multi-layer redistribution, and that may include flip chip interconnections with multi-size solder bumps.

BACKGROUND ART

In the manufacture and assembly of electronic devices, flip chip technology is increasingly popular as a high-density interconnection technique for mounting and electrically connecting semiconductor dies (or "chips") on redistribution substrates. Interconnection substrates for these techniques include silicon, ceramic, and flexible plastic, as well as printed circuit boards. The flip chip technique presents solder pads (typically utilizing solder balls) on the surface of the substrate.

Flip chip interconnections provide the shortest electrical connecting paths, and therefore the highest electrical performance and speed. Flip chip interconnections also accommodate the greatest number of chips and chip connections within a given space because the flip chip technique can present area arrays at any location, including the center area of the die, as well as or in addition to the periphery of the die.

The adoption of both a peripheral array and a center area array together in the same flip chip interconnection facilitates even further shrinking of package modules, and simultaneously provides better electrical performance due to lower inductance and cross talk from the direct solder ball connections.

Flip chip is therefore increasingly the interconnect method of choice for high performance semiconductor devices, such as application specific integrated circuits ("ASICs").

Input/output ("I/O") pads for flip-chip interconnection must have a final surface finish of solder-wettable metal. Since the metal finish ends up under the solder balls, or "solder bumps", it is referred to as under-bump metallization ("UBM"). A typical UBM metal stack consists of an adhesion layer (on the bottom), an optional barrier layer (in the middle), and one or more wetting layers (on the top). Structures meeting these requirements include stacks formed variously of titanium ("Ti"), nickel-vanadium ("NiV"), copper ("Cu"), aluminum ("Al"), chromium ("Cr"), and chromium-copper ("CrCu"), as follows: Ti/NiV/Cu, Al/NiV/Cu, Cr/CrCu/Cu, Ti/Cu and Cr/Cu. Layers of gold ("Au"), in addition, are optional. Typically, the UBM metals are deposited not only on the exposed target terminals, but as well on the polymer insulation layers (e.g., polyimide, benzocyclobutene ("BCB"), or polybenzoxazole ("PBO")), that form a surface passivation layer on the die.

To form the UBM pads on a substrate, such as a die, two methods are commonly used. One is the lift-off technique. The other is the etch-back process.

The lift-off technique requires accurate control of the deposition temperature of the UBM metals because the photoresist that is initially deposited typically cannot stand high temperatures over 150° C. Such temperatures can easily be exceeded during deposition of the UMB metals onto the photoresist. In addition, the shadow effect of the lift-off process requires a thicker metal deposition, therefore also requiring a longer deposition process time. Typically, high pressure scrubbing is also required to clean the substrate surface after stripping of the photoresist. Therefore, the etch-back process is commonly used rather than the lift-off technique.

However, the etch-back process also has problems. For example, when the UBM metals are deposited on the insulation or surface passivation layer, the residual stress of individual metal layers must be controlled. Otherwise, high residual stress may cause the metal and underlying polymer to peel and crack during patterning of the UBM pads for the etch-back process. These defects may happen even earlier, just after the deposition of the UBM metal layers.

Of the candidate UBM metals, Cr and NiV are well known for their high residual stress. If the UBM structures of Ti/NiV/Cu and Cr/CrCu/Cu and the like are employed, the above defects are prone to happen. Additional process steps can sometimes be taken to deter the defects from happening, but at the expense of reduced throughput and increased production cost. In some applications, it may be possible to omit the barrier layer of NiV, but the barrier layer is needed under lead-free solder bumping because the large amount of tin ("Sn") in the lead-free solder ball consumes the Cu intensively.

Another etch-back process problem has been encountered when a flip chip configuration has been adopted that utilizes both a peripheral array and a center area array at the same time for the flip chip interconnection. It has been desired in such configurations to have a bigger size for the solder balls in the peripheral array. If the difference between the two sizes of solder balls has not been significant, for example less than 100 µm, and the pitches between the UBM pads were big enough, both the bigger bumps and the smaller bumps could be formed on the substrate at the same time using electroplating or solder paste printing.

However, in other cases, the bigger bumps and smaller bumps (e.g., having over 100 µm bump height difference) could not be formed on the substrate at the same time because of the technical limits of the photoresist thickness and the pitches between the UBM pads. In this case, it was the practice to form smaller bumps only on the smaller substrate-like wafer or die. The bigger bumps were typically formed separately on the bigger, next level package substrate, such as a printed circuit board ("PCB"). Then, the smaller dies with the smaller bumps were mounted to the bigger, next level package. However, this caused production throughput to be reduced, and therefore, cost was increased.

In order to increase throughput and reduce cost, there thus remains a significant need to form both the bigger bumps and the smaller bumps, having over 100 µm bump height difference, on the larger substrate-like wafer with no more than one or two times of solder reflow.

Thus, a need still remains for reducing residual stress in flip chip UBM layers while simultaneously enabling the formation, on a single substrate, of multi-size solder bumps having considerable height differences. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit solder bumping system. A substrate is provided and a redistribution layer is formed on the substrate. An insulation layer is formed on the redistribution layer. The insulation layer has a plurality of openings therethrough. A first UBM layer of titanium is deposited on the insulation layer and in the openings therethrough. A second UBM layer of chromium/copper alloy is deposited on the first UBM layer. A third UBM layer of copper is deposited on the second UBM layer. UBM pads of at least two different sizes are formed from the UBM layers. Solder paste is printed over at least some of the UBM pads. The solder paste is reflowed to form at least smaller solder bumps on at least some of the UBM pads. Bigger solder bumps are formed on at least some of the UBM pads.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations and process steps are not disclosed in detail. Likewise, the drawings showing embodiments of the invention are semi-diagrammatic and not to scale and, particularly, some of the dimensions are for the clarity of presentation and are shown exaggerated in the drawing FIGs. Also, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

The present disclosure, which is in the field of wafer level package and electronic assembly technology, relates to multi-layer redistribution, with or without integrated passive devices, on interconnection and/or integrated circuit substrates. The disclosure applies in particular to flip chip interconnections for mounting integrated circuit ("IC") dies (or "chips") and the like on interconnection substrates like silicon, ceramic, flexible plastic, printed circuit boards, and the like.

As described in greater detail below, systems are disclosed for multi-layer redistribution, under bumping metallization ("UBM"), and multi-size solder bumping for flip chip interconnections on interconnection and/or integrated circuit substrates. The metallization of redistribution layers is accomplished with aluminum ("Al"), Al alloy, and copper ("Cu"), with or without an adhesion layer (such as chromium ("Cr"), titanium ("Ti"), or tantalum ("Ta")) and/or barrier layers (such as nickel-vanadium ("NiV"), titanium nitride ("TiN"), or tantalum nitride ("TaN")), according to the configuration and embodiment selected. The UBM of the disclosure includes Ti, chromium-copper ("CrCu"), and Cu layers that, it has been discovered, provide reduced residual stress in flip chip UBM layers, compared with conventional UBM like Cr/CrCu/Cu, Ti (or Al)/NiV/Cu, Ti/Cu, Cr/Cu. Multi-size solder balls with size differences greater than 100 μm are then provided on these UBM layers on the same substrate.

Figure 1:
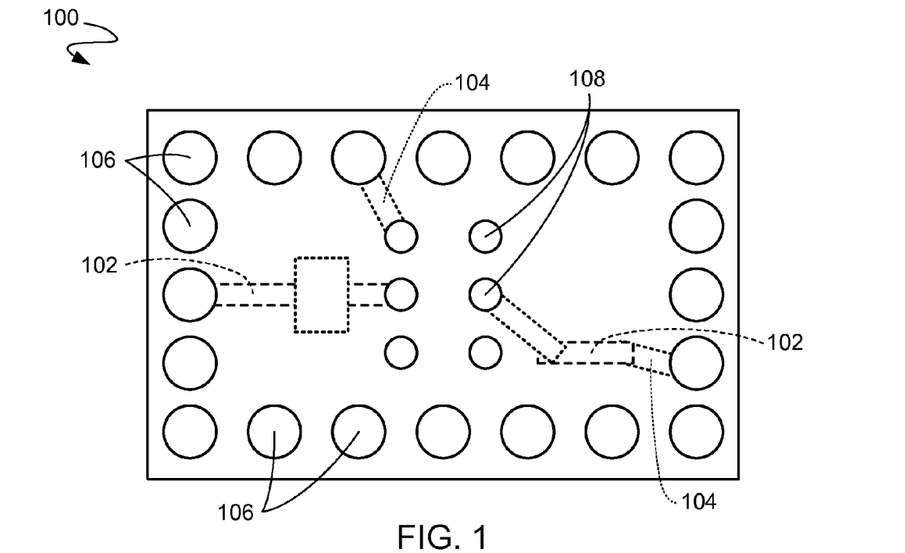
FIG. 1 shows the top face of a finished substrate having redistribution layers and bigger and smaller solder bumps.

Referring now to FIG. 1, therein is shown the top face of a finished substrate 100 having, among other things, first and second redistribution layers 102 and 104, bigger solder bumps 106, and smaller solder bumps 108. The finished substrate 100 may be based upon substrate materials such as, for example, silicon, ceramic, glass, and plastic.

The first and second redistribution layers 102 and 104 are used to redistribute the circuit connections and/or to create various passive components such as capacitors and inductors. The bigger solder bumps 106 form a peripheral array, which is used to mount the finished substrate 100 to the next level packaging board, substrate, or mother board (not shown). The smaller solder bumps 108 form an area array, positioned in this embodiment at the center of the finished substrate 100, which is used to connect with an IC die (not shown).

Figure 2:
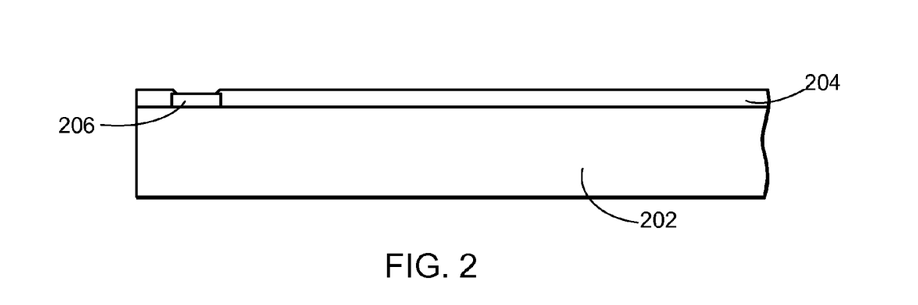
FIG. 2 shows the first of a series of steps for forming different sizes of solder bumping.

Referring now to FIG. 2, therein is shown the first of a series of steps for forming different sizes of solder bumping, such as the bigger solder bumps 106 (FIG. 1) and the smaller solder bumps 108 (FIG. 1), on a multilayer-redistribution substrate such as the finished substrate 100 (FIG. 1). In particular, a substrate 202 is shown having a passivation layer 204 formed thereon. The passivation layer 204 has a pad 206 formed in an opening therethrough. The pad 206 is an input/output ("I/O") pad that is optionally provided when the substrate 202 incorporates underlying circuits. The substrate 202 may be formed, for example, of silicon, ceramic, glass, or plastic materials. The passivation layer 204 may be formed, for example, of silicon oxide, silicon oxynitride, silicon nitride, or various polymer passivation materials.

Figure 3:
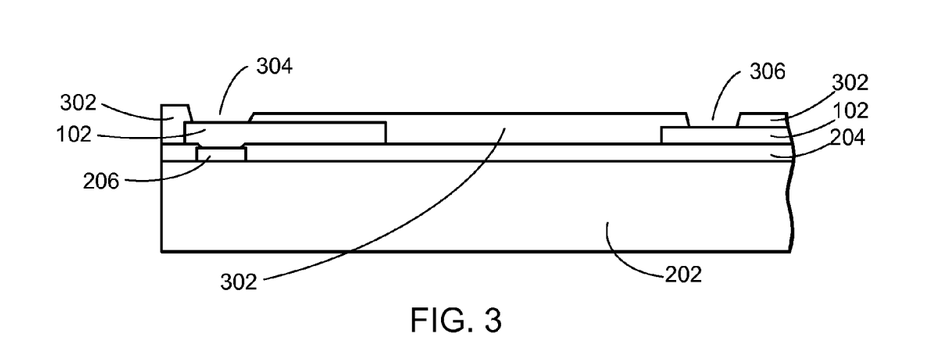
FIG. 3 shows the structure of FIG. 2 after formation thereon of a first redistribution layer.

Referring now to FIG. 3, therein is shown the structure of FIG. 2 after formation thereon of the first redistribution layer 102, which is optional depending upon the embodiment and circuit configuration at hand. The first redistribution layer 102 is formed on the passivation layer 204. The first redistribution layer 102 may be formed of Al, Al alloy, or Cu, and may have additional layers underneath. The thickness of the first redistribution layer 102, depending upon the embodiment and needs at hand, will generally range from about 1 μm to 9 μm.

A first insulation layer 302 is then deposited on the substrate 202 and the various layers thereon, with openings of 304 and 306 therethrough to the first redistribution layer 102. The first insulation layer 302 may be formed of polyimide, benzocyclobutene ("BCB"), or polybenzoxazole ("PBO"), generally with a thickness from about 4 μm to 12 μm depending on the thickness of the first redistribution layer 102 and the needs at hand.

In another embodiment, the first redistribution layer 102 is not present and only the opening 304 is formed, connecting through to the pad 206.

Figure 4:
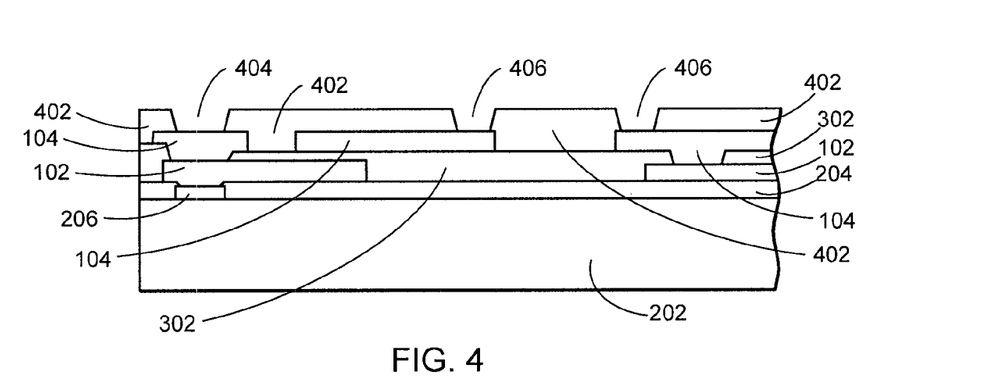
FIG. 4 shows the structure of FIG. 3 after formation thereon of a second redistribution layer.

Referring now to FIG. 4, therein is shown the structure of FIG. 3 after formation thereon of the second redistribution layer 104 by patterning and deposition thereof onto the substrate 202 and the various layers thereon. The material of the second redistribution layer 104 may be formed of Al, Al alloy, or Cu with or without barrier and adhesion layers. The thickness of the second redistribution layer 104, depending upon the embodiment and needs at hand, will generally range from about 1 μm to 9 μm.

A second insulation layer 402 is then deposited on the second redistribution layer 104 and the first insulation layer 302. The thickness of the second insulation layer 402, depending upon the embodiment and needs at hand, will generally range from about from 4 μm to 12 μm depending on the thickness of the second redistribution layer 104. The second insulation layer 402 may be formed of polyimide, BCB, or PBO.

The second insulation layer 402 has openings 404 and 406, of different sizes respectively, formed therethrough to the second redistribution layer 104 therebeneath. In other embodiments, there may be additional opening sizes through the second insulation layer 402 to the second redistribution layer 104.

Figure 5:
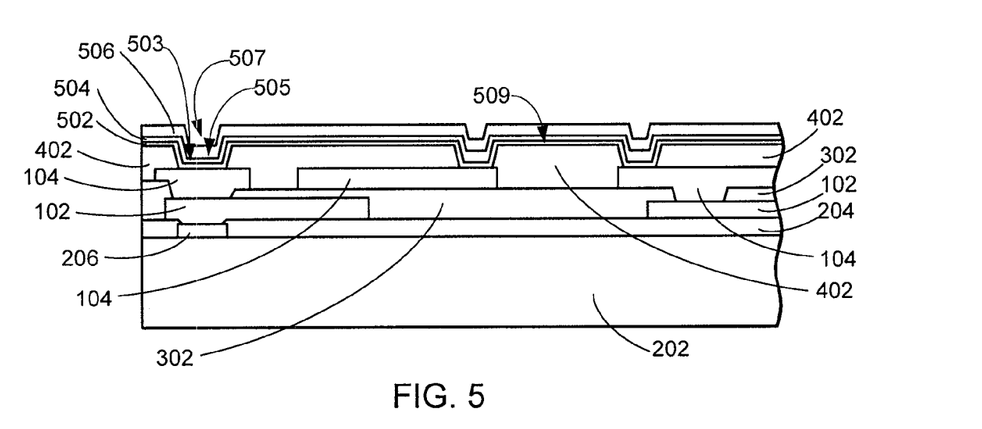
FIG. 5 shows the structure of FIG. 4 after deposition thereon of UBM layers.

Referring now to FIG. 5, therein is shown the structure of FIG. 4 after deposition thereon of UBM layers 502, 504, and 506. The UBM layers 502, 504, and 506 in this embodiment are individual metallic layers that are deposited on the second insulation layer 402 with physical and electrical connections through the openings 404 and 406 to the second redistribution layer 104.

The UBM layer 502 having a first recess 503 is formed of Ti with a thickness from 500 Å to 1500 Å, and preferably 800 Å. The UBM layer 504 is formed of a CrCu alloy of 40-60% Cr to Cu, and preferably 50% Cr and formed in direct contact with a side of the UBM layer 502 opposite the second insulation layer 402. The UBM layer 504 has a second recess 505, the UBM layer 504 in the second recess 505 is below a top surface 509 of the second insulation layer 402, and has a thickness from 2500 Å to 5000 Å, and preferably 3500 Å. The UBM layer 506 is formed in direct contact with a side of the UBM layer 504 opposite the UBM layer 502 and formed of Cu with a thickness of 5000 Å to 2 μm, and preferably 8000 Å. The UBM layer 506 includes a third recess 507 and the UBM layer 506 in the third recess 507 is directly on the UBM layer 504 in the second recess 505.

It has been discovered that these UBM layers and layer materials provide significantly reduced residual stress in flip chip UBM layers, and that this provides a robust UBM process for flip-chip interconnection. Processes utilizing this newly discovered UBM structure give better processability without cracking and peeling. Structure formed therewith readily pass reliability tests.

Figure 6:
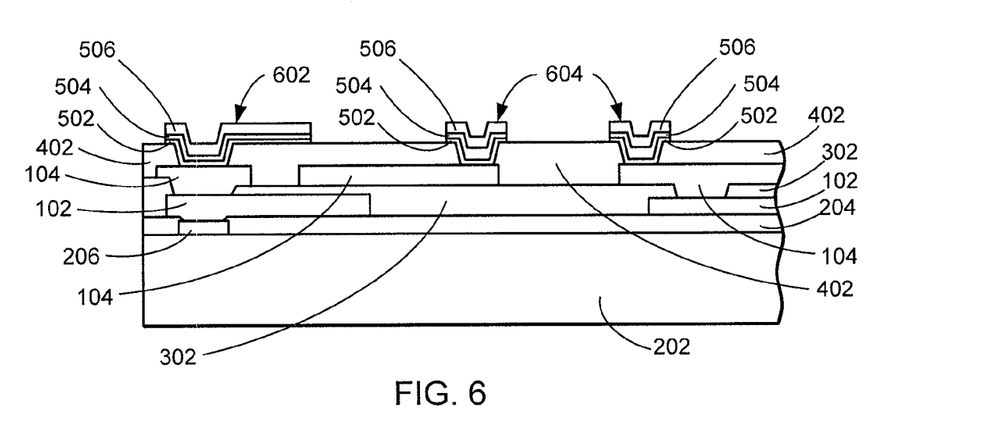
FIG. 6 shows the structure of FIG. 5 after masking and etching of the UBM layers to form UBM pads.

Referring now to FIG. 6, therein is shown the structure of FIG. 5 after masking and etching the UBM layers 502, 504, and 506 to form UBM pads 602 and 604 in and over the respective openings 404 (FIG. 4) and 406 (FIG. 4). The UBM pad 602 is bigger than the UBM pad 604, and the bigger solder bumps 106 (FIG. 1) and the smaller solder bumps 108 (FIG. 1) will correspondingly be formed respectively on the UBM pads 602 and 604. That is, the bigger UBM pads 602 are used to form the bigger solder bumps 106, while the smaller UBM pads 604 are used to form the smaller solder bumps 108, in accordance with the corresponding sizes of the openings 404 and 406.

Figure 7:
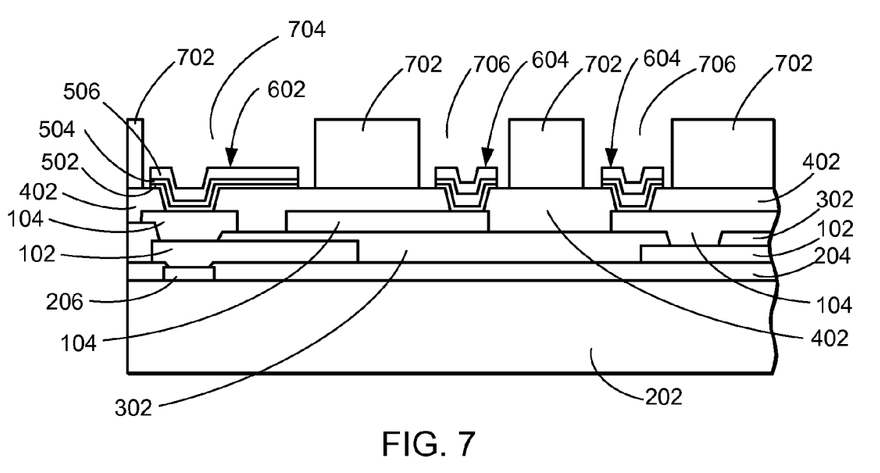
FIG. 7 shows the structure of FIG. 6 having thereon a layer of a patterned photoresist.

Referring now to FIG. 7, therein is shown the structure of FIG. 6 having thereon a layer 702 of a patterned photoresist. The layer 702 may be formed, for example, using optical lithography, and in one embodiment may be a spin-coated photoresist or a photosensitive dry film with a thickness of about 50 μm to 200 μm. The layer 702 has been patterned and formed to provide openings 704 and 706 therethrough, respectively, over and to the UBM pads 602 and 604.

Figure 8:
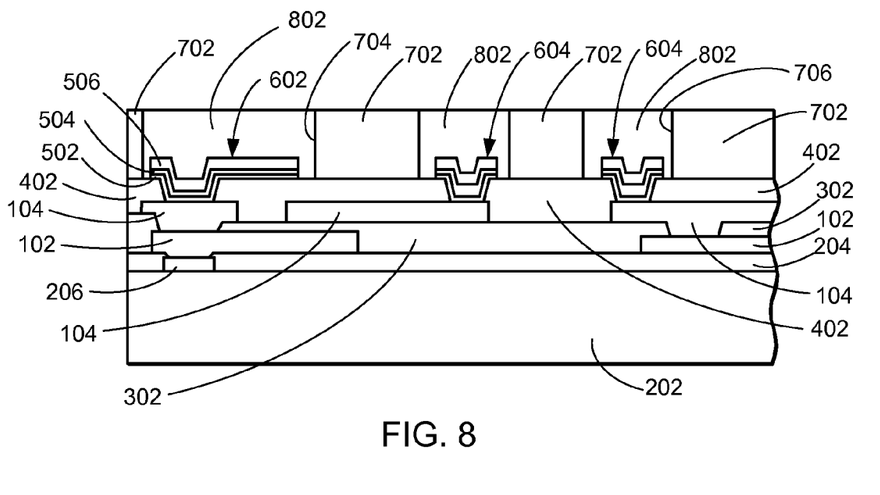
FIG. 8 shows the structure of FIG. 7 after solder paste is printed into openings in the photoresist.

Referring now to FIG. 8, therein is shown the structure of FIG. 7 after solder paste 802 is filled, for example by solder paste printing, into the openings 704 and 706 in the layer 702, and over the respective UBM pads 602 and 604 therebeneath. The layer 702 acts as a polymer stencil in this first solder paste printing process. The solder paste may be, for example, eutectic or lead-free solder paste.

Figure 9:
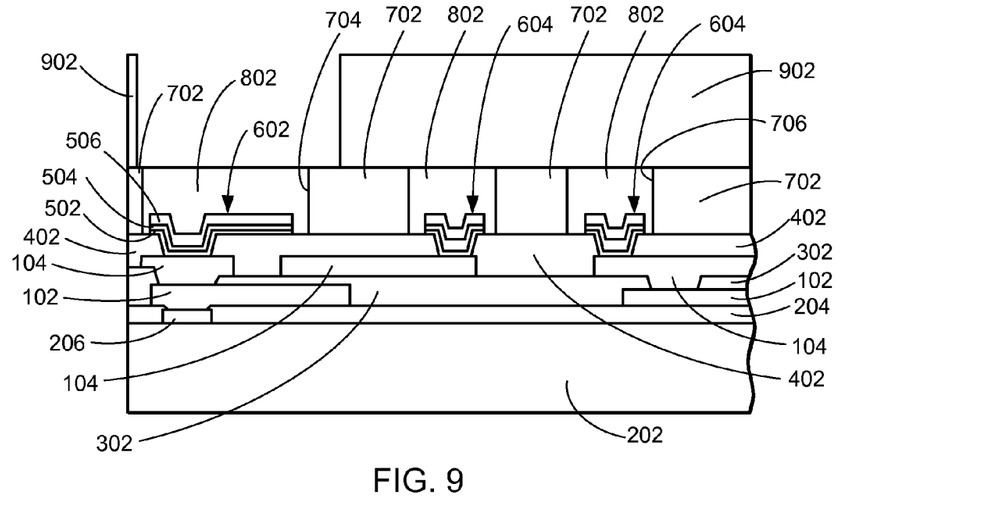
FIG. 9 shows the structure of FIG. 8 after a metal stencil is applied on the photoresist.

Referring now to FIG. 9, therein is shown the structure of FIG. 8 after a metal stencil 902 is applied on the layer 702. The metal stencil 902 has openings 904 above only the openings 704; there are no openings in the metal stencil 902 above the openings 706.

Figure 10:
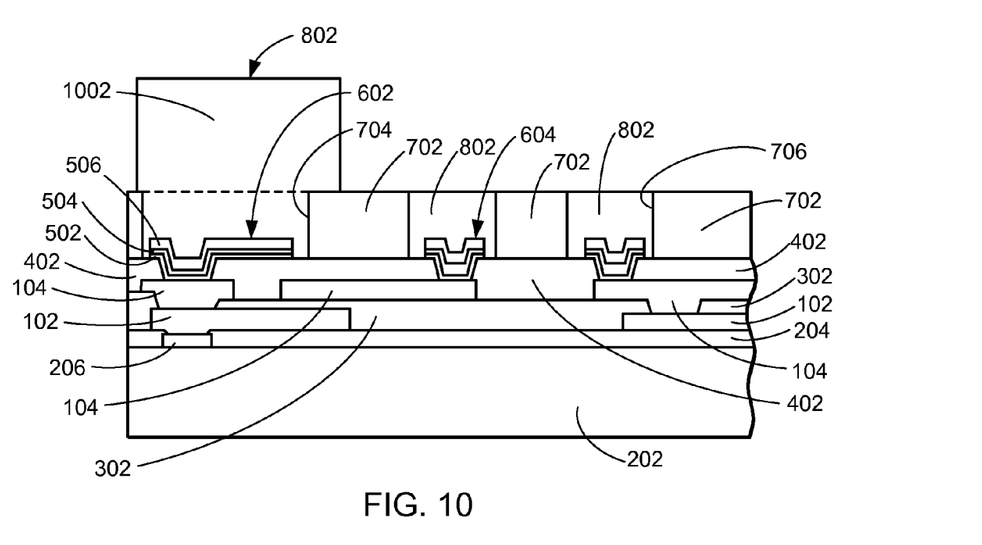
FIG. 10 shows the structure of FIG. 9 following a second solder paste printing process using the metal stencil, followed by removal of the metal stencil.

Referring now to FIG. 10, therein is shown the structure of FIG. 9 following a second solder paste printing process using the metal stencil 902 (FIG. 9), followed by removal of the metal stencil 902. The second solder paste printing process leaves an additional stack 1002 of the solder paste 802 on top of the openings 704.

Figure 11:
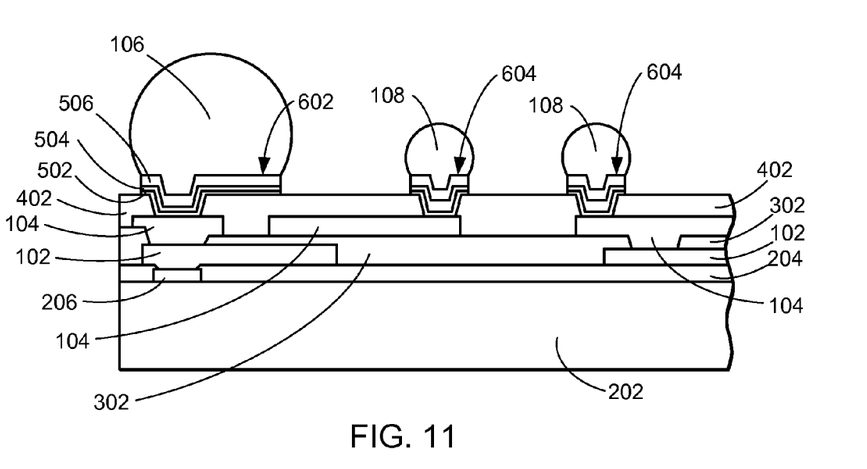
FIG. 11 shows the structure of FIG. 10 following a reflow process and stripping of the photoresist.

Referring now to FIG. 11, therein is shown the structure of FIG. 10 following a reflow process for the entire structure and stripping of the layer 702 (FIG. 10) of photoresist. Two kinds of solder bumps with much different size are thereby formed on the substrate as shown in FIG. 11: the bigger solder bumps 106 and the smaller solder bumps 108. This is a result of the different volumes of the solder paste 802 (FIG. 10) above and in the openings 704 and 706, respectively. The bigger solder bumps 106 and the smaller solder bumps 108 are in direct contact with the UBM layer 506 in the third recess 507 of FIG. 5.

Figure 12:
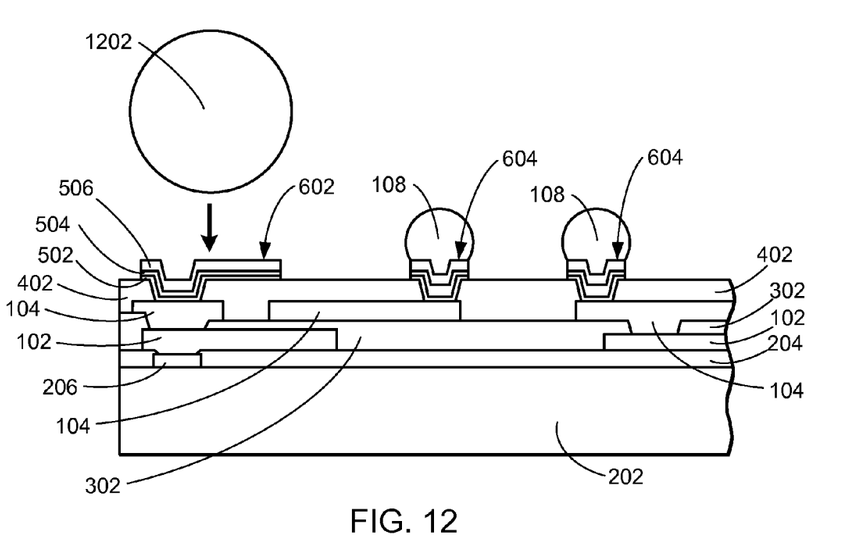
FIG. 12 shows the formation of bigger solder bumps using the solder ball dropping technique.

Referring now to FIG. 12, therein is shown a schematic representation of the formation of bigger solder bumps using the solder ball dropping technique. FIG. 12 thus illustrates an alternate embodiment for forming the bigger and smaller solder bumps together on a big substrate-like wafer, such as the substrate 202. With this embodiment, the smaller solder bumps 108 are formed by the solder printing method as shown in FIGS. 7 and 8, but the opening 704 is not formed in the layer 702 of photoresist and is not present for the solder printing. Only the openings 706 are presented to the solder printing. Additionally, in another embodiment, the layer 702 may be a metal stencil rather than a photoresist. After the forming of the smaller solder bumps 108, bigger solder balls 1202 are dropped on the bigger UBM pads 602, and the structure then goes through the reflow process.

Therefore, both the methods shown in FIG. 11 and in FIG. 12 produce bigger and smaller solder bumps. The bigger solder bumps have at least 100 μm of bump height difference greater than the smaller solder bumps, and the multi-sized solder bumps can be formed together on big substrate-like wafers such as shown in FIG. 1.

Figure 13:
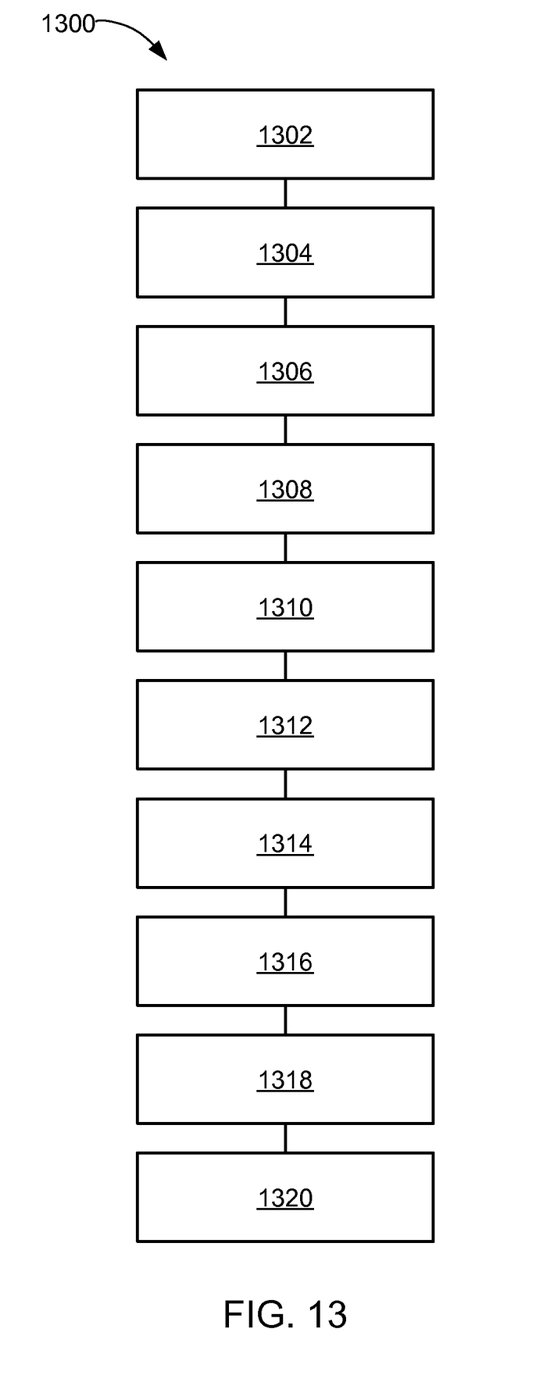
FIG. 13 is a flow chart of an integrated circuit solder bumping system in accordance with an embodiment of the present invention.

Referring now to FIG. 13, therein is shown a flow chart for an integrated circuit solder bumping system 1300 in accordance with an embodiment of the present invention. The method includes providing a substrate in a block 1302; forming a redistribution layer on the substrate in a block 1304; forming an insulation layer on the redistribution layer, the insulation layer having a plurality of openings therethrough, in a block 1306; depositing a first UBM layer of titanium on the insulation layer and in the openings therethrough, in a block 1308; depositing a second UBM layer of chromium/copper alloy on the first UBM layer, in a block 1310; depositing a third UBM layer of copper on the second UBM layer, in a block 1312; forming UBM pads of at least two different sizes from the UBM layers, in a block 1314; printing solder paste over at least some of the UBM pads, in a block 1316; reflowing the solder paste to form at least smaller solder bumps on at least some of the UBM pads, in a block 1318; and forming bigger solder bumps on at least some of the UBM pads, in a block 1320.

It has been discovered that the present invention thus has numerous advantages.

An important advantage of the present invention is that it provides reduced residual stress in flip chip UBM layers while simultaneously forming, on a single substrate, multi-size solder bumps having considerable height differences.

Another advantage is that multi-size solder bumps with height differences over 100 μm can be readily and economically fabricated on single, big, substrate-like wafers.

Another advantage of the invention is that it provides a new, robust UBM process for flip-chip interconnections, producing new UBM structures that give better processability without cracking and peeling.

Yet another advantage of the present invention is that it teaches and discloses a choice of integrated processes for forming bigger and smaller solder bumps, utilizing solder printing for both, or solder printing with solder ball dropping, according to the needs at hand and the embodiment that is chosen.

Still another advantage of the present invention is that structures produced thereby dependably pass reliability testing.

Another important advantage of the present invention is that the forming together of bigger solder bumps and smaller solder bumps, that may have over 100 μm of bump height difference, on a big substrate-like wafer, improves process throughput and thus reduces costs.

Yet another important advantage of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit solder bumping system of the present invention furnishes important and heretofore unknown and unavailable solutions, capabilities, and functional advantages for providing reduced residual stress in flip chip UBM layers while simultaneously forming, on a single substrate, multi-size solder bumps having considerable height differences. The resulting processes and configurations are straightforward, cost-effective, uncomplicated, highly versatile and effective, can be implemented by adapting known technologies, and are thus readily suited for efficiently and economically manufacturing semiconductor devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hitherto set forth herein or shown in the accompanying drawings are to be interpreted in an illustrative and non-limiting sense.

The invention claimed is:

1. An integrated circuit solder bumping system, comprising:
    a redistribution substrate;
    a first redistribution layer on the redistribution substrate;
    a first insulation layer on the first redistribution layer;
    a second redistribution layer on the first insulation layer;
    a second insulation layer on the second redistribution layer, the second insulation layer having a plurality of openings of at least two different sizes therethrough;
    a first UBM layer of titanium on at least portions of the second insulation layer and in the openings therethrough;
    a second UBM layer of chromium/copper alloy on the first UBM layer;
    a third UBM layer of copper on the second UBM layer;
    UBM pads formed over the openings and being formed from the UBM layers, the UBM pads being formed of at least two different sizes according to the sizes of the openings;
    smaller solder bumps on at least some of the UBM pads; and
    bigger solder bumps on at least some of the UBM pads, the bigger solder bumps having at least 100 μm of bump height difference greater than the smaller solder bumps.

2. The system of claim 1 wherein;
    the redistribution layers further comprise redistribution layers of aluminum, aluminum alloy, copper, an alloy thereof, a compound thereof, or a combination thereof; and
    the insulation layers further comprise insulation layers of polyimide, benzocyclobutene, or polybenzoxazole, a compound thereof, or a combination thereof.

3. The system of claim 1 wherein;
the redistribution layers further comprise redistribution layers having a thickness in the range from 1 μm to 9 μm; and
the insulation layers further comprise insulation layers having a thickness in the range from 4 μm to 12 μm.

4. The system of claim 1 wherein;
the first UBM layer further comprises a layer having a thickness in the range from 500 Å to 1500 Å, and preferably 800 Å;
the second UBM layer further comprises a chromium/copper alloy layer of 40-60% chromium to copper, and preferably 50% chromium, and having a thickness in the range from 2500 Å to 5000 Å, and preferably 3500 Å; and
the third UBM layer further comprises a layer having a thickness in the range from 5000 Å to 2 μm, and preferably 8000 Å.

* * * * *